(12) United States Patent
Schwilch et al.

(10) Patent No.: US 7,723,988 B2
(45) Date of Patent: May 25, 2010

(54) PASSIVELY DAMPED MAGNETIC RESONANCE (MR) DETECTION CONFIGURATION

(75) Inventors: Arthur Schwilch, Uster (CH); Daniel Marek, Moeriken (CH); Nicolas Freytag, Binz (CH)

(73) Assignee: Bruker Biospin AG, Faellanden (CH)

( * ) Notice: Subject to any disclaimer, the term of this patent is extended or adjusted under 35 U.S.C. 154(b) by 224 days.

(21) Appl. No.: 11/882,150

(22) Filed: Jul. 31, 2007

(65) Prior Publication Data
US 2008/0061783 A1 Mar. 13, 2008

(30) Foreign Application Priority Data
Aug. 9, 2006 (DE) .................. 10 2006 037 196

(51) Int. Cl.
*G01V 3/00* (2006.01)
(52) U.S. Cl. ....................... 324/322; 324/318
(58) Field of Classification Search ............... 324/322, 324/318
See application file for complete search history.

(56) References Cited

U.S. PATENT DOCUMENTS

| | | | | |
|---|---|---|---|---|
| 5,051,700 | A | * 9/1991 | Fox | ............................ 324/322 |
| 5,172,061 | A | 12/1992 | Crooks | |
| 5,546,000 | A | * 8/1996 | Maas et al. | .................. 324/322 |
| 6,242,918 | B1 | 6/2001 | Miller | |
| 7,109,714 | B2 | * 9/2006 | Rudakov et al. | ............. 324/322 |

OTHER PUBLICATIONS

D.I. Hoult "Fast Recovery with a Conventional Probe" Journal of Magnetic Resonance 57, 394-403 (1984).

C. Anklin, M. Rindlisbacher, G. Otting and F.H. Laukien "A probehead with switchable quality factor. Suppression of radiation damping".Magn. Res. B106, p. 199-201, (1995).

D.I. Hoult "Fast recovery, high sensitivity NMR probe and preamplifier for low frequencies". Rev. Sci. Instr. 50(2), (1979).

J.B. Miller, B.H. Suits, A.N. Garroway, M.A. Hepp "Interplay among recovery time, signal, and noise: Series- and parallel-tuned circuits are not always the same". Concepts in Magn. Res. vol. 12, Issue 3, p. 125-136 (2000).

D.I. Hoult, B. Bhakar "NMR Signal Reception: Virtual Photons and Coherent Spontaneous Emission". Concepts in Magn. Res. vol. 9, Issue 5, p. 227-297 (1997).

* cited by examiner

*Primary Examiner*—Louis M Arana
(74) *Attorney, Agent, or Firm*—Paul Vincent

(57) ABSTRACT

A magnetic resonance (MR) detection configuration comprising at least one RF resonant circuit with an inductance, a preamplifier module and an RF receiver, wherein a reactive transformation circuit is connected between a high-impedance point of the inductance and a low-impedance connecting point of the RF resonant circuit, which acts as an impedance transformer and wherein the low-impedance connecting point is connected to the preamplifier module via an RF line having a characteristic impedance, is characterized in that at least one passive damping impedance is provided in the preamplifier module downstream of the RF line, wherein the passive damping impedance can be connected to the resonant circuit by a switching means during a damping and/or transmitting process, and wherein the respective amount of the complex reflection factor of passive damping impedance relative to the characteristic impedance of the RF line exceeds a value of 0.5. This presents an MR detection configuration with an extensive damping concept, wherein all three processes (transmitting, damping and receiving processes) are optimized.

20 Claims, 11 Drawing Sheets $\tau_{rise}$  $\tau_{fall}$  $\tau_{EV}$

+ I$_{BIAS}$ (D1, D2)

−HV

+ I$_{2BIAS}$ (D3)

SV  DV  EV

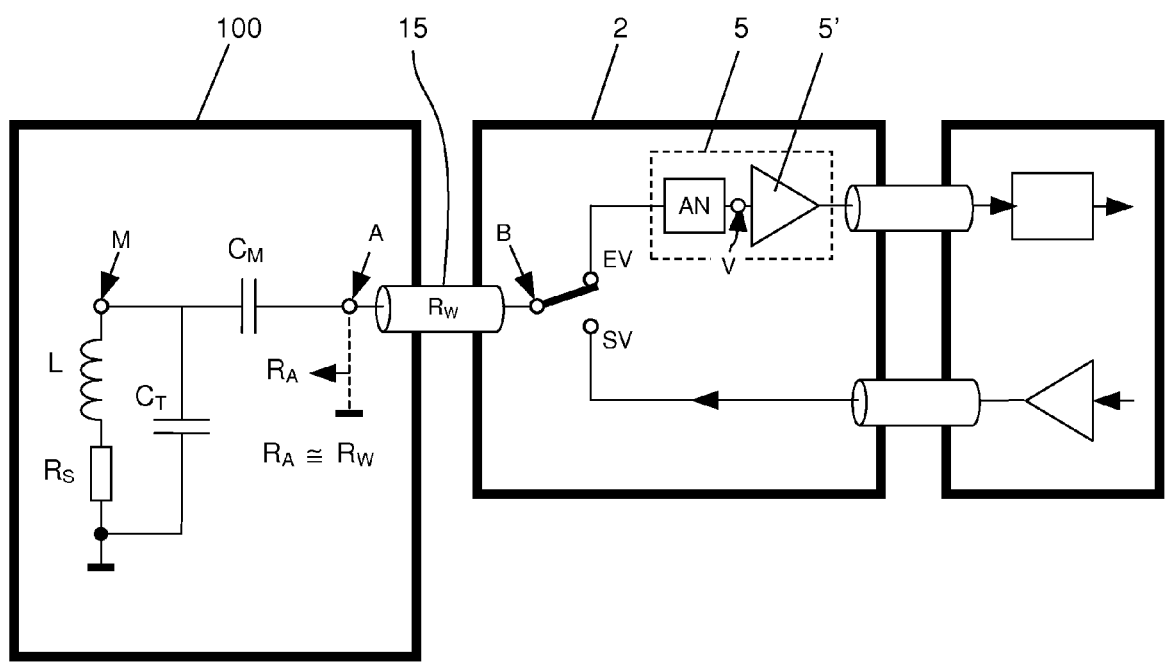
PRIOR ART Fig.10

PASSIVELY DAMPED MAGNETIC RESONANCE (MR) DETECTION CONFIGURATION

This application claims Paris Convention priority of DE 10 2006 037 196.8 filed Aug. 9, 2006 the complete disclosure of which is hereby incorporated by reference.

BACKGROUND OF THE INVENTION

The invention concerns a magnetic resonance (MR) detection configuration comprising at least one RF resonant circuit with an inductance, a preamplifier module, and an RF receiver, wherein a reactive transformation circuit is connected between a high-ohmic point of the inductance of the RF resonant circuit and a low-ohmic connecting point of the RF resonant circuit to act as an impedance transformer, and wherein the low-ohmic connecting point of the RF resonant circuit is connected to the preamplifier module via an RF line having a characteristic impedance.

A configuration of this type is disclosed in [4].

A sensor of an NMR spectrometer consists essentially of one radio frequency (RF) resonant circuit which is disposed closely around an NMR test sample. The RF resonant circuit normally functions as a transmitting antenna in a first time period, the so-called transmitting process. A strong pulse-shaped RF current is supplied to the RF resonant circuit, which generates a strong RF field in the NMR test sample and excites the nuclear spins contained therein. In a subsequent second time period, the so-called receiving process, the RF resonant circuit functions as a detector and receives the RF field radiated by the nuclear spins, the so-called FID signal (FID=free induction decay) which is supplied to the preamplifier and its matching network via an RF line.

In order to optimize the signal-to-noise ratio (=SINO) of the nuclear magnetic resonance signal (NMR signal), noise matching of the preamplifier to the RF line must be obtained. One end of the RF line which extends to the preamplifier may thereby not be terminated with the characteristic impedance of the RF line, which could cause standing waves to be generated in the RF line [4] during the receiving process. These influence the Q value and the resonance frequency of the loaded RF resonant circuit, such that the RF line and the matching network of the preamplifier must also be regarded as parts of the RF resonant circuit.

In order to obtain a high signal sensitivity, i.e. a high SINO of the FID signal, during the receiving process, the series loss resistance of the inductance of the RF resonant circuit must i.a. be minimum in order to also minimize the thermal noise produced therein. For this reason, cryogenically cooled RF resonant circuits of normally conducting materials and also of high temperature super conductor (HTSC) materials are used. This substantially reduces the noise and at the same time considerably increases the Q value of the unloaded RF resonant circuit (resonant circuit without cable and matching network).

However, RF resonant circuits with high Q values are disadvantageous in that, during the transmitting process, the pulse-shaped transmission energy cannot be immediately received by the RF resonant circuit or be removed therefrom, since the RF resonant circuit requires both a certain build-up time as well as decay time, which are longer the higher the Q value. A power-matched resonant circuit has twice the damping factor or half the time constant compared to a freely oscillating resonant circuit. This is easy to demonstrate. This double damping usually determines the build-up and decay behavior of the resonant circuit. This is, however, not sufficient e.g. for NMR spectroscopy applications.

The decay process is mostly critical, since it usually covers the start of the receiving process and thereby also the start of the FID signal, thereby preventing exact temporal separation between the transmission and receiving processes. For this reason, a third time period is suitably defined between the transmission and receiving process (called damping process below).

Additional complications result from the fact that modern NMR magnet systems have superconducting coils. For this reason, the space within the room temperature bore (RT bore), i.e. within the measuring space available, is very confined. In consequence thereof, the RF resonant circuit must be spatially separated from the preamplifier and be electrically connected to an RF line. Due to the high NMR frequencies of today's spectrometers, the length of this RF line may be a multiple of the wavelength of the NMR frequency. Depending on the construction and the NMR frequency, the RF line may, however, also be very short compared to the wavelength.

The problems, configurations and properties that occur in the three defined time periods are described below. In particular, the problems associated with RF resonant circuits having very high Q values are discussed.

During transmission, the width of the NMR spectrum that can be excited is limited by the available bandwidth of the transmission system and thereby, in particular, by the bandwidth of the RF resonant circuit used for transmission. A very high Q value of the RF resonant circuit may cause the bandwidth of the RF resonant circuit to be too small to excite the desired frequency range of the magnetic spins. Means must be found to nevertheless obtain the required excitation bandwidths of the NMR spectrum.

During damping, additional measures must be taken in order to maximally reduce the exponentially decaying process of the coil current in response to the transmission pulse, such that reception of the FID signal can be started as quickly as possible. This is very important, since the start of the FID signal contains i.a. very important information about the initial phase of the individual resonance frequencies which are contained in the FID signal. When this information is lost, the base line and the shape of the NMR resonance lines will be distorted in the NMR spectrum obtained after Fourier transformation (FT), and moreover the integral over the individual NMR lines can no longer be correctly calculated.

In addition to distortions in the spectrum, a long decay process also produces an undesired SINO loss, since no FID signal can be acquired during the decay process, i.e. part of the FID signal is lost.

The extent to which the decay process must have vanished before the receiving process can be started depends mainly on the preamplifier and the subsequent detection circuit. These must work in the linear region of their characteristic dependencies, i.e. must not be saturated. Acquisition of the FID signal may not be started before this condition is met.

The receiving process is a very complex process that substantially involves three problems:

1. The problem of radiation damping. This occurs when the spin concentration of the solvent or the test substance is very high. The integrating effect of the numerous magnetic spins in the test sample may be compared with a resonant circuit which is strongly electromagnetically coupled to the RF resonant circuit. In this case, the RF resonant circuit may react to this "resonant circuit", which can cause broadenings, distortions and phase errors of the spectral lines.

When two resonant circuits are provided which are disposed at a certain separation from each other, their electromagnetic coupling and thereby their mutual influence increases, the larger the Q values of the individual resonant circuits. The situation for radiation damping is similar, with one resonant circuit being defined by the magnetic spins and the other by the RF resonant circuit. The first resonant circuit has a very high intrinsic effective Q value due to the properties of the magnetic spins. This Q value may be between $10^6$ and $10^9$. For this reason, the height of the Q value of the second resonant circuit, i.e. the RF resonant circuit, is important for observation of the coupling. This view is equivalent to the observation that, with a high Q value of the RF resonant circuit, large currents flow therein in response to the NMR signals, which again acts on the spins depending on the phase of the resonator current. In order to minimize radiation damping, this Q value should be minimum without thereby deteriorating the SINO.

2. The decay signal of the resonator in response to the transmission pulse is greatly reduced after damping but still has a residual portion that can cause distortions of the base line in the NMR spectrum. For this reason, it is important to also damp the RF resonant circuit during the receiving process. The time constant of the decay signal during the receiving process is thereby called $\tau_{EV}$. The damping value that can be obtained during the receiving process is naturally smaller (i.e. the time constant is longer) than that during the damping process, since the circuit must be optimized primarily to an optimum SINO and not to optimum damping.

3. The third problem is caused when the Q value of the RF resonant circuit during the receiving process is too high for receiving the entire width of the desired NMR spectrum. Precise damping of the RF resonant circuit during the receiving process provides adjustment of the spectral receiving range of the RF resonant circuit to the width of the desired NMR spectrum. Such damping during the receiving process is only reasonable when the RF resonant circuit is also additionally damped during the transmission process, such that it yields the desired excitation bandwidth. The latter should be larger or equal to the width of the desired NMR spectrum.

It is important that damping of the RF resonant circuit does not deteriorate the SINO during the receiving process, which may seem contradictory at first, but can be addressed using so-called "electronic damping". Damping of the RF resonant circuit is obtained by the electronic input impedance of the preamplifier [2]-[4]. The adjustment network of the preamplifier itself should, however, be noise-matched, i.e. the preamplifier itself should see optimum source impedance (the optimum source impedance is that source impedance that produces the highest SINO) downstream of its adjustment circuit.

In [1], the Q value of an RF resonant circuit 100' is kept small during the transmission and damping process using a so-called "Q switch" (FIGS. 11a, 11b). The name already indicates that a resistance $R_Q$ is added to the RF resonant circuit 100' using a switch 11. The resistance $R_Q$ and the switch 11 are connected in series and connected between the high-impedance point M of inductance L of the RF resonant circuit 100' and ground. The resistance $R_Q$ damps the RF resonant circuit 100', thereby reducing its Q value. The switch 11 is realized in most cases using a PIN diode $D_Q$ (FIG. 11b). However, switches with field effect transistors (FET) are also feasible. The PIN diode $D_Q$ is blocked with a high voltage HV which is applied in the reverse direction, or brought into a conducting state using a current $I^{11}{}_{BIAS}$ in the forward direction.

This configuration is disadvantageous in that the additional components (resistance $R_Q$, PIN diode $D_Q$ etc.) must be housed in the vicinity of the sensitive RF resonant circuit and can thereby deteriorate the homogeneity of the static magnetic field due to their magnetic susceptibility. Additionally, a control signal must be guided in the very sensitive region of the RF resonant circuit. Additional wiring of the RF resonant circuit unavoidably reduces the Q value during the receiving process and thereby produces an undesired SINO loss. The parallel loss resistance of the PIN diode $D_Q$ in the blocked state is sufficient to cause this loss.

Moreover, the PIN diode $D_Q$ of cryogenically cooled RF resonant circuits should also be cooled. This is possible only to a limited degree due to the "carrier-freeze-out-effect" in semiconductors, which is very problematic.

The Q switch cannot be directly used for damping the RF resonant circuit during the receiving process, since it would cause an excessive SINO loss. Special methods have been developed with which the Q switch is intermittently used, i.e. is switched on temporarily within a time interval between two data points and subsequently switched off again prior to detection of the next data point. This method also produces a SINO loss, since there is less time for data acquisition.

The configuration used in [2] consists of an RF resonant circuit and a preamplifier which are located close to each other and therefore need not be connected to each other via an RF line. The preamplifier is negative feedbacked and thereby generates an input impedance which depends on the size of the feedback. This input impedance is used as a damping impedance for the RF resonant circuit during the receiving process and is directly connected to the high-impedance point of the RF resonant circuit. Since the damping impedance is generated electronically by active elements, this type of damping is also called "electronic damping". In the conventional circuit, two separate couplings to the RF resonant circuit are used: the first for the transmission process and the second for the damping and receiving processes. Both couplings are provided at the high-impedance point of the RF resonant circuit. During the transmission process, the RF resonant circuit is damped by normal power matching.

During the decay time of the RF resonant circuit (damping process), the latter practically remains undamped throughout the entire time, since the electronic damping effect is cancelled by limiting diodes for safety reasons, as is explained below. It is only at the very end of the decay time, that the electronic damping again becomes effective, but can no longer cause any significant reduction of the overall time of the decay process.

The preamplifier is optimally noise-matched during the receiving process. When the quotient between the magnitude of the input impedance and the magnitude of optimum source impedance of the preamplifier differs greatly from 1, the RF resonant circuit can also be damped without any SINO loss. The RF resonant circuit is additionally loaded by the two adjustment paths during the transmission and receiving process, which nevertheless finally produces a SINO loss, mainly when the Q values of the RF resonant circuit are very high.

Today's preamplifiers usually require limiting diodes at the input, which should protect against overloading during the transmission process. These act more or less like low-ohmic voltage sources of approximately 2 V and thereby prevent the occurrence of excessive voltages at the sensitive input of the preamplifier during the transmission pulse and the subsequent decay process. In consequence thereof, the electronic damping by the input impedance of the preamplifier becomes active and provides its damping effect only when the preamplifier with limiting diodes is operating in a linear range. The main portion of the decay process is therefore not additionally damped in the present configuration, which operates only with an electronic impedance as damping means, and the coil energy dies down with the undamped time constant.

Moreover, in current NMR spectrometers comprising high field superconducting magnets, it is practically not possible to closely arrange the RF resonant circuit and preamplifier, since there is no space for the preamplifier in the direct vicinity of the RF resonant circuit. The magnetic field strength of the NMR magnet is also too high for unproblematic function of the preamplifier and moreover cryogenically cooled RF resonant circuits and preamplifiers require different cryogenic temperatures for optimum operation, i.e. both units would have to be thermally insulated from each other, which, in turn, would cause space problems.

Additionally, the above-described feedback of the preamplifier practically cannot be realized in today's high field systems for reasons of stability. The associated high NMR frequencies e.g. in a 900 MHz NMR spectrometer the feedback of the preamplifier may produce a strong oscillation tendency which can be eliminated only with great effort, if at all.

For all above-mentioned reasons, the configuration disclosed in [2] is not suitable for today's high field NMR spectrometers.

[3] Discloses a configuration that comprises an RF resonant circuit and a preamplifier which are also disposed close to each other. It mentions the possibility of spatial separation of both objects and connecting them via an RF line, but does not mention the associated problems (treatment of optimum damping under the limitation that results from adjustment to the line of impedance $R_W$). As in the configuration of [2], the configuration of [3] also achieves electronic damping of the RF resonant circuit using the input impedance of the active part of the preamplifier (without matching network), wherein this damping causes no loss in optimum SINO and is stronger the more the ratio between the input impedance and the optimum noise impedance of the preamplifier differs from 1 (overcoupling). The RF resonant circuit is coupled at the low-impedance point A of the RF resonant circuit. Different types of impedance transformation between point A and the high-impedance point M of the RF resonant circuit are proposed and examined in view of the SINO.

In the configuration of [3], the decay time is reduced by 30%. This is, however, far too little for today's high field systems. Rather, reductions of approximately 90% are desired. Moreover, with large "overcoupling", undesired effects occur, e.g. saturation effects in the preamplifier and the decay times can increase again. The decay process may even contain two frequency components whose envelope decays very slowly.

The configuration disclosed in [4] also comprises one RF resonant circuit 100 and a preamplifier module 2 which are, however, positioned at a separation from each other and are connected via an RF line 15 (FIG. 10). The RF resonant circuit 100 comprises an inductance L and a loss resistance $R_S$ and is connected at a low-impedance connecting point A to a preamplifier module 2 via the RF line 15 of line impedance $R_W$, which comprises a preamplifier 5 with an matching network AN and with the active part 5' of the preamplifier.

In order to maintain the SINO, the impedance transformation of the loss resistance $R_S$ of the inductance L of the RF resonant circuit 100 relative to a point V between the matching network AN and the input of the active part 5' of the preamplifier 5 must produce an impedance value which is equal to the optimum source impedance of the active part of the preamplifier 5'. When this condition is met, and when the ratio between the magnitudes of the optimum source impedance and the input impedance of the active part of the preamplifier 5' differs greatly from 1, the transform of the input impedance of the preamplifier 5 relative to the low-impedance connecting point A of the RF resonant circuit 100 differs greatly from the line impedance $R_W$ of the RF line 15 between the RF resonant circuit 100 and the preamplifier module 2 and thereby provides much stronger damping of the RF resonant circuit 100 compared to conventional power matching.

The impedance transformation between the RF resonant circuit 100 and the preamplifier 5 is performed such that, in a first step, the loss resistance $R_S$ of the inductance L of the RF resonant circuit 100 is transformed to a value $R_A$ at the low ohmic connecting point A using a coupling capacitor. $R_A$ is usually equal to $R_W$. The RF line 15 which has the impedance $R_W$ is thereby matched at the low ohmic connecting point A without reflection such that the loss in the RF line is reduced.

When viewing from point B, disposed at the end of the RF line 15 facing away from the RF resonant circuit, towards the line 15, the resistance value $R_W$ appears. It is transformed in a second step by means of the matching network AN such that the active part of the preamplifier 5' sees the optimum source impedance at point V.

[4] thus describes extensive measures for reducing radiation damping during the receiving process. These measures may also have a strong damping effect on the RF resonant circuit during the receiving process without producing a SINO loss. Coupling to the RF resonant circuit is effected at the low impedance connecting point A of the RF resonant circuit. Optimum damping of the RF resonant circuit during the receiving process and the produced advantages for decay of the RF resonant circuit is, however, not mentioned.

The Q value of the RF resonant circuit plays a central role in the design of a transmitting/receiving system for NMR and for this reason there is great need for a method that optimally reduces the disturbing influences of the high Q value of the RF resonant circuit during the transmission, damping and receiving process, wherein the SINO must not decrease during the receiving process.

The above-described prior art only provides solutions with electronic damping impedances (input impedances of preamplifiers) for the damping process and when damping is performed at the low impedance point A of the RF resonant circuit, which do not optimally damp the RF resonant circuit due to their non-linear properties, since damping acts, in particular, only when the amplitude of the oscillation has become sufficiently small that it is in the linear range of the preamplifier. Towards this end, it must have largely decayed already. Thus, most of the time passes without damping.

The conventional proposed solutions merely present individual solutions which are either optimized for the transmission and damping process or for the receiving process, but do not provide a comprehensive solution that provides optimum relationships in all three processes.

It is therefore the underlying purpose of the invention to provide an MR detection configuration, wherein the RF resonant circuit and the preamplifier module are spatially separated from each other, comprising an extensive damping concept, wherein all three processes (transmitting, damping and receiving process) are optimized.

SUMMARY OF THE INVENTION

This object is achieved in accordance with the invention in that at least one passive damping impedance is provided in the preamplifier module downstream of the RF line, wherein the passive damping impedance can be switched to the resonant circuit during a damping and/or transmission process, wherein one RF transmitter transmits RF pulses to the RF resonant circuit for exiting a spin system using a switching means, and wherein the respective amount of the complex reflection factor of the passive damping impedance relative to the impedance of the RF line exceeds a value of 0.5.

Passive damping impedance means an impedance which is realized through one or more passive components or a passive circuit.

The passive damping impedances are parts of a damping path or a transmitting path, wherein the transmitting path connects the switching means to the RF transmitter during transmission, and the damping path connects the switching means to a damping impedance during damping. Moreover, a receiving path is provided which connects the switching means to the preamplifier during the receiving process. Using the switching means of the inventive device, the RF resonant circuit can optionally be connected to the damping path and the associated damping impedance, to the transmission path and the associated damping impedance, or to a receiving path.

The low impedance connecting point of the resonant circuit generated by impedance transformation which is connected to the RF resonant circuit and which also represents one end of the RF line, has two important features:

1. As viewed from the low impedance connecting point towards the RF resonant circuit, approximately the impedance of the RF line appears such that the RF line is terminated quasi without reflection at the low impedance connecting end.

2. The low impedance connecting point serves as a connecting point for the damping impedance or its transform.

Since, in the inventive damping concept, the low impedance connecting point is continually used to damp the RF resonant circuit, this damping concept is suited, in particular, when the damping impedances are to be positioned at a spatial separation from the RF resonant circuit using the RF line, and are to be switched on or off, thereby preventing any disturbance of the sensitive surroundings of the RF resonant circuit.

Optimum noise match of the preamplifier during the receiving process is the main object in order to obtain a maximum SINO. Moreover, the transform of the input impedance of the preamplifier at the low impedance connecting point should be as close as possible to the optimum damping resistance to yield maximum damping of the RF resonant circuit without SINO loss. A decay signal during the receiving process produces broad artificial spectral lines. The signal decays with the time constant TEV during the receiving process which should be as short as possible so that the residual signal is minimum. The phase of the transform of the preamplifier input impedance that appears at the low impedance connecting point, which is required to achieve maximum damping, can be realized through selection of the length of the RF line.

During the damping process, maximum damping of the RF resonant circuit can be realized by means of the damping impedance of the damping process. Towards this end, the damping impedance of the damping process transformed at the low impedance connecting point must be approximately equal to the optimum damping resistance $(R_D)_{OPT}$. Of all possible resistance values, $(R_D)_{OPT}$ is that value which produces optimum high damping of the RF resonant circuit and can be calculated for the respective configuration. The optimum damping resistance thereby depends, to first order, on the frequency $\omega$ and the matching impedance $M_K$ and $X_C$, respectively.

Maximum damping of the RF resonant circuit during the transmitting process can also be realized using the damping impedance of the transmitting process. If compatible with power requirements, the transform of the damping impedance at the low impedance connecting point should thereby lie at the optimum impedance. In this case, the damping states are the same during the damping and transmitting processes and one single damping impedance is sufficient, i.e. the damping impedance of the transmitting process. This must be switched such that it is also effective during the damping process. If this is not possible, the maximum damping that is compatible with the power requirements can be obtained by weaker transformation in the damping network (i.e. wherein the impedance of the connection that is guided to the RF coil of the respective damping network is closer to $R_W$).

While the above-described prior art only contains automatic damping due to power matching in view of the transmitting process and in view of damping at the low impedance connecting point of the RF resonant circuit, the present invention provides additional passive damping impedances in order to present an appropriate damping impedance for each process (transmitting process, damping process, receiving process), thereby improving damping. This is possible without impairing the performance of the system, since today's power transmitters for NMR have sufficient power to optimally supply the RF resonant circuit and also cover the power loss of this additional passive damping impedance.

The inventive MR detecting configuration considerably reduces the time constant.

The RF resonant circuit preferably excites the spin system during the transmitting process and detects FID signals during a receiving process, wherein the switching means connects the RF resonant circuit to the RF receiver during the receiving process and to the RF transmitter during the transmitting process. The RF resonant circuit is connected to the RF receiver via the receiver path, the RF resonant circuit is connected to the RF transmitter via the transmitter path.

In an embodiment of this type, the switching means advantageously comprises a three-phase RF switch, i.e. a switch with three switching positions.

The RF resonant circuit may alternatively serve only to detect FID signals during the receiving process, and can be damped with the passive damping impedance during the damping process, wherein an RF transmitting circuit is provided for exciting the spin system during the transmitting process, which is preferably disposed spatially orthogonal relative to the RF resonant circuit, wherein at least one further passive damping impedance is connected to the RF transmitting resonant circuit during the transmitting and/or damping process, such that the RF transmitting resonant circuit can be damped with the further passive damping impedance.

In an advantageous embodiment of the inventive MR detection configuration, at least one of the passive damping impedances is selected such that an optimum impedance $(R_D)_{OPT}$ is present at the low impedance connecting point A, as viewed in the direction of the RF line, wherein in an inductive transformation circuit, in which the reactive portion of the coupling inductance is capacitively compensated by a capacitor, $(R_D)_{opt} = \omega^* M_k$ applies with good approximation, wherein $M_k$ corresponds to the mutual inductance of the inductive coupling of the transformation circuit.

The optimum impedance causes maximum damping and thereby the most rapid decay of the RF resonant circuit. Maximum damping means that the envelope of the current in the resonant circuit damps out within minimum time. The energy present in the RF resonant circuit is thereby dissipated, i.e. transferred into heat, in order to prevent oscillation of the energy between the RF resonant circuit and a different resonant structure. The deviation of the values of the impedances from the optimum impedance may be up to ±30% without substantially extending the decay process (approximately 10% larger time constant).

In an alternative embodiment, at least one of the damping impedances is selected such that there is an optimum impedance $(R_D)_{OPT}$ at the low-impedance connecting point as viewed towards the RF line, wherein the reactive transformation circuit comprises a capacitive reactance $X_S$ which acts as an impedance transformer, wherein the optimum impedance $(R_D)_{OPT}$ is determined by the value of the reactance $X_S$ and wherein $(R_D)_{OPT} = X_S$ applies to good approximation.

The reactance is thereby disposed between the high impedance point and the low impedance connecting point of the RF resonant circuit as an impedance transformer.

A particularly advantageous embodiment of the invention comprises a damping network for generating the connectable passive damping impedance, wherein the damping network comprises a connection to the RF transmitter and is thereby not matched to the RF line, rather to the RF transmitter. The RF resonant circuit is additionally damped during the transmitting process in order to increase its frequency bandwidth to the required value. This reduces the rise time of the current in the inductance of the RF resonant circuit during the transmitting process.

A further advantageous embodiment comprises a controllable RF resistance, in particular, a PIN diode for generating the passive damping impedance. The damping of the RF resonant circuit during the damping process can be defined by means of the RF resistance, such that the optimum impedance is advantageously generated at the low impedance connecting point.

The invention also concerns a method for damping an RF resonant circuit of an above-described MR detection configuration, wherein during the damping and/or transmitting process, the RF resonant circuit is damped with a time constant reduction larger than a factor of 2 compared to termination with the characteristic impedance of the RF line at the low impedance connecting point by connecting the passive damping impedance to the resonant circuit using the switching means.

The spin system is advantageously excited during the transmission process and the FID signal is detected during the receiving process using the same RF resonant circuit.

Alternatively, the FID signal is detected during the receiving process using the RF resonant circuit and the spin system is excited during the transmitting process using the RF transmitting resonant circuit.

In an advantageous variant of the inventive method, a passive damping impedance, which is connected via the RF transmitting line, is generated during the transmitting and/or damping process using the damping network which is connected to the RF transmitter, and is not matched to the line, rather to the transmitter.

The optimum impedance is moreover advantageously generated using the controllable RF resistance and the subsequent transformation at the low impedance connecting point.

The inventive MR detecting configuration and the associated method realize optimum damping of the RF resonant circuit both during the transmitting, damping and receiving processes, wherein optimum damping in this connection means the damping, at which the transformed damping impedance, relative to the low impedance connecting point, assumes that value which maximally damps the RF resonant circuit.

Further advantages of the invention can be extracted from the description and the drawing. The features mentioned above and below may be used individually or collectively in arbitrary combination. The embodiments shown and described are not to be understood as exhaustive enumeration but have exemplary character for describing the invention.

BRIEF DESCRIPTION OF THE DRAWING

FIG. 10 shows a transmitting/receiving device in accordance with prior art, in which the RF resonant circuit is damped at its low-impedance connecting point during the receiving process;

DESCRIPTION OF THE PREFERRED EMBODIMENT

Figure 1:
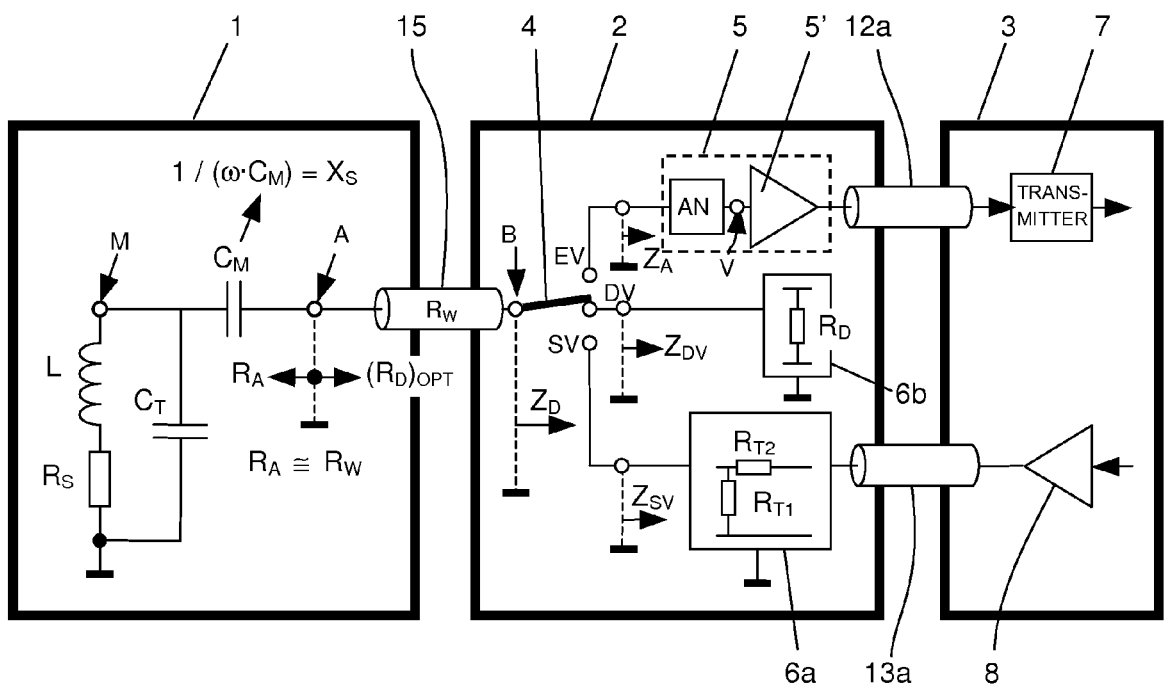
FIG. 1 shows a basic circuit diagram of one embodiment of the inventive MR detection configuration with damping devices for the RF resonant circuit which are activated or deactivated during the transmitting and damping process.

The inventive device is schematically shown in FIG. 1. It is divided into three main blocks, i.e. an RF resonant circuit 1 which may be at a very low temperature (e.g. 20 K or less), a preamplifier module 2 whose temperature is e.g. at 77 K and a transmitter/receiver module 3 with an RF transmitter 8 and an RF receiver 7, which is usually housed in a spectrometer console. The preamplifier module 2 comprises a receiving path with a low-noise preamplifier 5 comprising a matching network AN and an active preamplifier 5', a transmission path with a damping network 6a for a transmitting process SV with damping resistances $R_{T1}$, $R_{T2}$ and a damping path with a damping network 6b for a damping process DV with a damping resistance $R_D$ and a switching means in the form of an RF switch 4 with which the transmission process SV, damping process DV and receiving process EV can be initiated by producing a connection between the RF receiver circuit 1 and the transmitting path, damping path or receiving path. The damping networks 6a, 6b generate damping impedances $Z_{SV}$, $Z_{DV}$ for damping the RF resonant circuit 1.

The radio frequency signals are transmitted among the three main blocks via an RF line 15 with a characteristic impedance $R_W$, an RF output line 12a, and an RF input line 13a, which are preferably designed as coaxial cables having low thermal conductivity. A low impedance connecting point A of the RF resonant circuit 1 is thereby connected to the preamplifier module 2 via the RF line 15.

Figure 4:
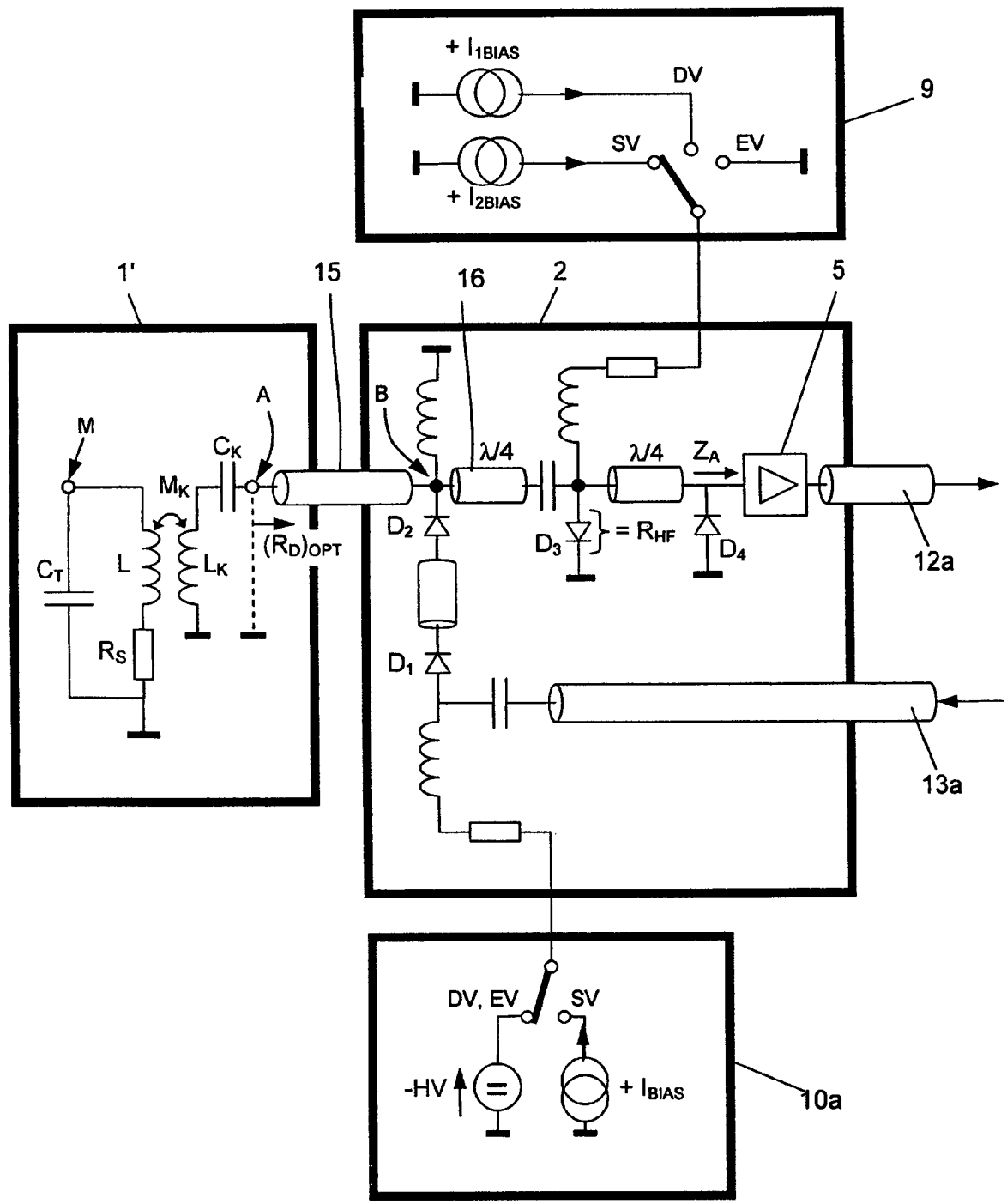
FIG. 4 shows a detailed diagram of a further embodiment of the inventive MR detection configuration with an inductive impedance transformer for coupling to the RF resonant circuit and with optimum damping of the RF resonant circuit during the damping process using the RF resistance of a diode.

The RF resonant circuit 1 of FIG. 1 is designed as a parallel resonant circuit with capacitive coupling, wherein an inductance L with a loss resistance $R_S$ is connected in parallel to a resonance capacity $C_T$. Other resonant circuit topologies with capacitive and/or inductive coupling are also feasible (FIG. 4).

In the embodiment of the inventive MR detection configuration shown in FIG. 1, the preamplifier module 2 can be switched by means of a switch, i.e. the RF switch 4, to three different states (transmitting process SV, damping process DV and receiving process EV). Thus, the RF resonant circuit 1 can be damped with the passive damping impedance $Z_{SV}$ during the transmitting process SV and with the passive damping impedance $Z_{DV}$ during the damping process DV. During the transmitting process SV, the RF amplifier (power amplifier) 8 is connected through to the RF resonant circuit 1.

In the short time between transmission and reception, the RF resonant circuit 1 is connected to the damping resistance $R_D$ (damping process DV), such that the current in the RF resonant circuit 1 quickly decays. As will be shown below, the dimensioning of this damping resistance $R_D$ is extremely critical but can be optimized. The RF resonant circuit 1 is subsequently connected to the low-noise preamplifier 5 (LNA) (receiving process EV). The complex input impedance $Z_A$ of the LNAs 5 together with the length of the RF line 15 is selected such that the energy still present in the RF resonant circuit 1 due to the transmitting pulse is optimally discharged. The circuit is primarily dimensioned for an optimum, i.e. high SINO (noise match).

In the inventive MR detection configuration, the RF resonant circuit 1 and the preamplifier module 2 are spaced apart and are connected to each other via the RF line 15. The RF switch 4 of the embodiment of FIG. 1 has three phases, i.e. the switch comprises three positions or switching possibilities. The switch and the impedance-controlled and noise-matched LNA 5 permit rapid decay of the RF resonant circuit 1 after application of a transmitting pulse.

The inventive device permits use of cryogenically cooled RF resonant circuits 1 with maximum quality factor (e.g. of high temperature superconductors=HTSC) in today's high field systems without having to accept the above-described problems caused by the decay process.

Figure 2:
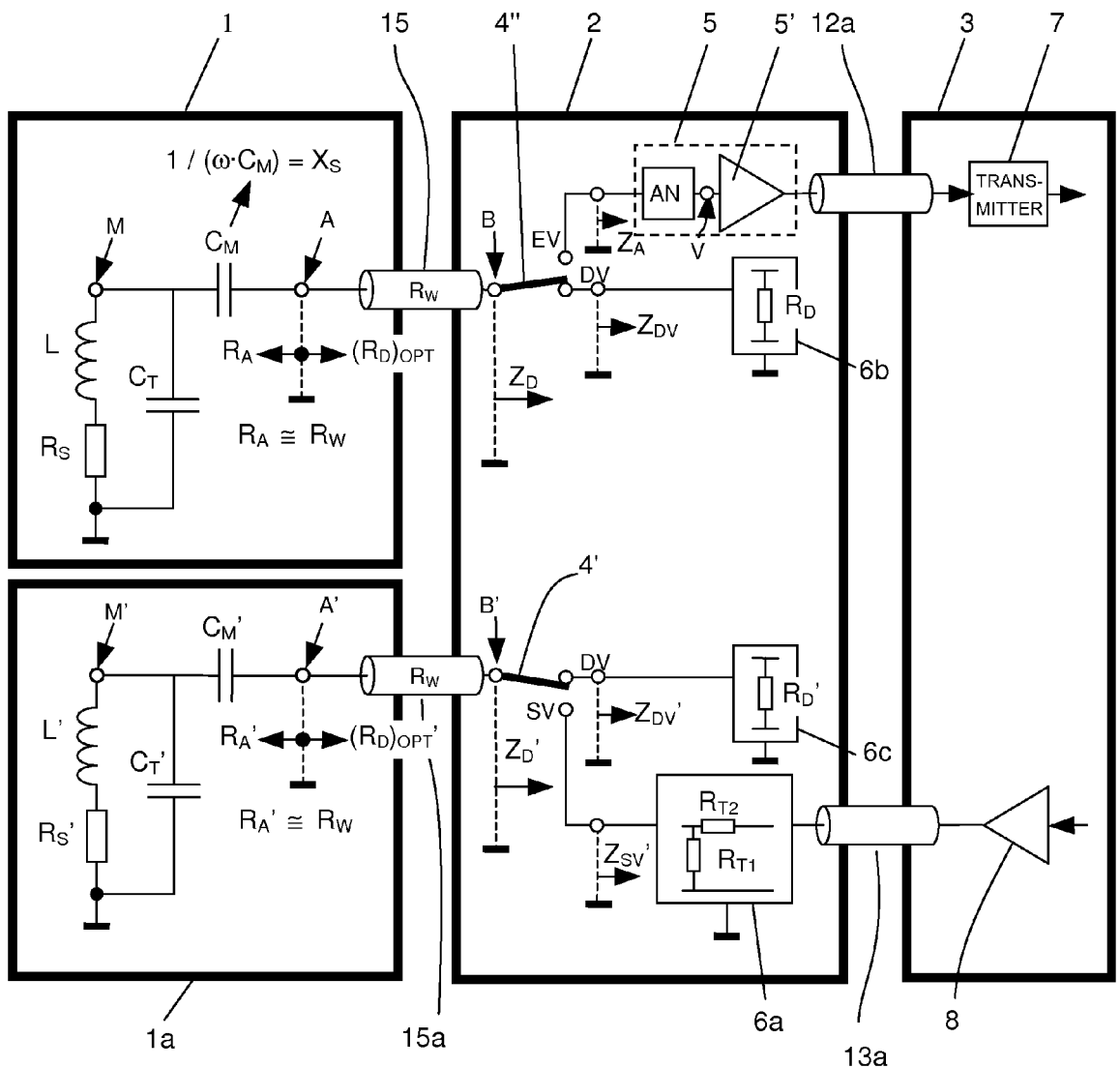
FIG. 2 shows a basic circuit diagram of an alternative embodiment of the inventive MR detection configuration comprising a separate RF transmitting circuit for exciting the spin system.

FIG. 2 shows an alternative embodiment, wherein, in addition to the RF resonant circuit 1, a further RF transmitting resonant circuit 1a is provided which may have substantially the same structure. The RF resonant circuit 1 of this embodiment only detects FID signals during the receiving process EV and during the damping process DV and is damped with passive damping impedance $Z_{DV}$, wherein switching over from the damping network 6b for the damping process DV to the preamplifier 5 for the receiving process EV is effected by a switch 4". The RF transmitting resonant circuit 1a is provided to excite the spin system during the transmission process SV, which is preferably disposed orthogonally to the RF resonant circuit 1 and can be damped by further passive damping impedances $Z_{SV}'$, $Z_{DV}'$. A switch 4' is also provided in this case for switching over between the damping network 6a for the transmitting process SV and a damping network 6c with a damping resistance $R_D'$ during the damping process DV. Each RF resonant circuit 1, 1a is connected to the preamplifier module 2 via an RF line 15, 15a. During the damping process DV, the two switches 4", 4' connect the RF lines 15, 15a to the RF resonant circuit 1 or the RF transmitting resonant circuit 1a to the respective damping resistance $R_D$, $R_D'$ of the damping networks 6b, 6c.

One feasible implementation variant is explained in detail below with reference to FIG. 3. The RF resonant circuit 1 is modelled as a parallel resonant circuit with capacitance $C_T$ and the inductance L and with the loss resistance $R_S$. The RF resonant circuit 1 is adjusted to 50 ohms via the coupling capacitor (matching capacitance) $C_M$. The temperature of the RF resonant circuit 1 may be much lower than the temperature of the following preamplifier module 2. The RF resonant circuit 1 and the preamplifier module 2 are therefore spatially and thermally separated by the RF line 15.

Two transmitting diodes D1, D2 in the preamplifier module 2, which belong to the switching means, transmit an input signal 13b from the RF transmitter 8 (not shown in FIG. 3) into the RF resonant circuit 2 during the transmitting process SV. A current $I_{BIAS}$ of sufficient strength flows through the two transmitting diodes D1, D2 during the transmitting process SV due to a control circuit 10a. During the transmitting process SV, a further diode D3 is also operated by the signal from a further control circuit 9 with a DC current applied in the forward direction, such that the low impedance of the diode D3 is transformed to a reference point B at the end of the RF line 15 facing away from the RF resonant circuit 1 to a high impedance via a λ/4 line 16. This high impedance is parallel to the 50 ohm system which comprises the transmitting diodes D1 and D2 and the cable 15 and the RF resonant circuit, and can thereby be neglected, i.e. the high impedance then has no influence on the 50 ohm system. When the diode D3 is not ideal, a further diode D4 is provided as additional protection of the LNAs 5 against transmitting power.

The transmitting pulse is followed by switching over to the so-called damping process DV as quickly as possible by means of the control circuits 9, 10. During the damping process DV, the energy of the RF resonant circuit 1 is withdrawn as quickly as possible, i.e. the current of the inductance L is reduced as quickly as possible. This is equivalent to maximizing the real part of the impedance which loads the inductance L at a high impedance point M. The imaginary part of this impedance plays a negligible role. It merely determines the frequency of the decay signal but not its time constant. It can be shown that, for high Qs of inductance L, the following equation applies with approximation: $(R_D)_{OPT}=1/(\omega \cdot C_M)$. In other words, there is an optimum resistance $(R_D)_{OPT}$ which the RF resonant circuit 1 should see in the direction of the preamplifier module 2 at the low impedance connecting point A in order to minimize the decay time. This optimum resistance $(R_D)_{OPT}$ amounts to some kΩ, depending on the Q of the inductance L. The diode D3 is then loaded with the signal of the control circuit 9, such that its high-frequency series resistance $R_{HF}$, together with the transform of the input impedance $Z_A$ of the amplifier 5, is transformed via a λ/4 line 16 and the RF line 15 in the vicinity of or, even better, exactly at $(R_D)_{OPT}$. At the same time, the two transmitting diodes D1 and D2 must be blocked by a sufficiently large negative reverse voltage (high voltage=HV) and thus be connected with a sufficiently high ohmic value to prevent them from being automatically transferred into the conducting and low ohmic states due to strong decay signals, and thereby disturbing $(R_D)_{OPT}$.

Figure 3:
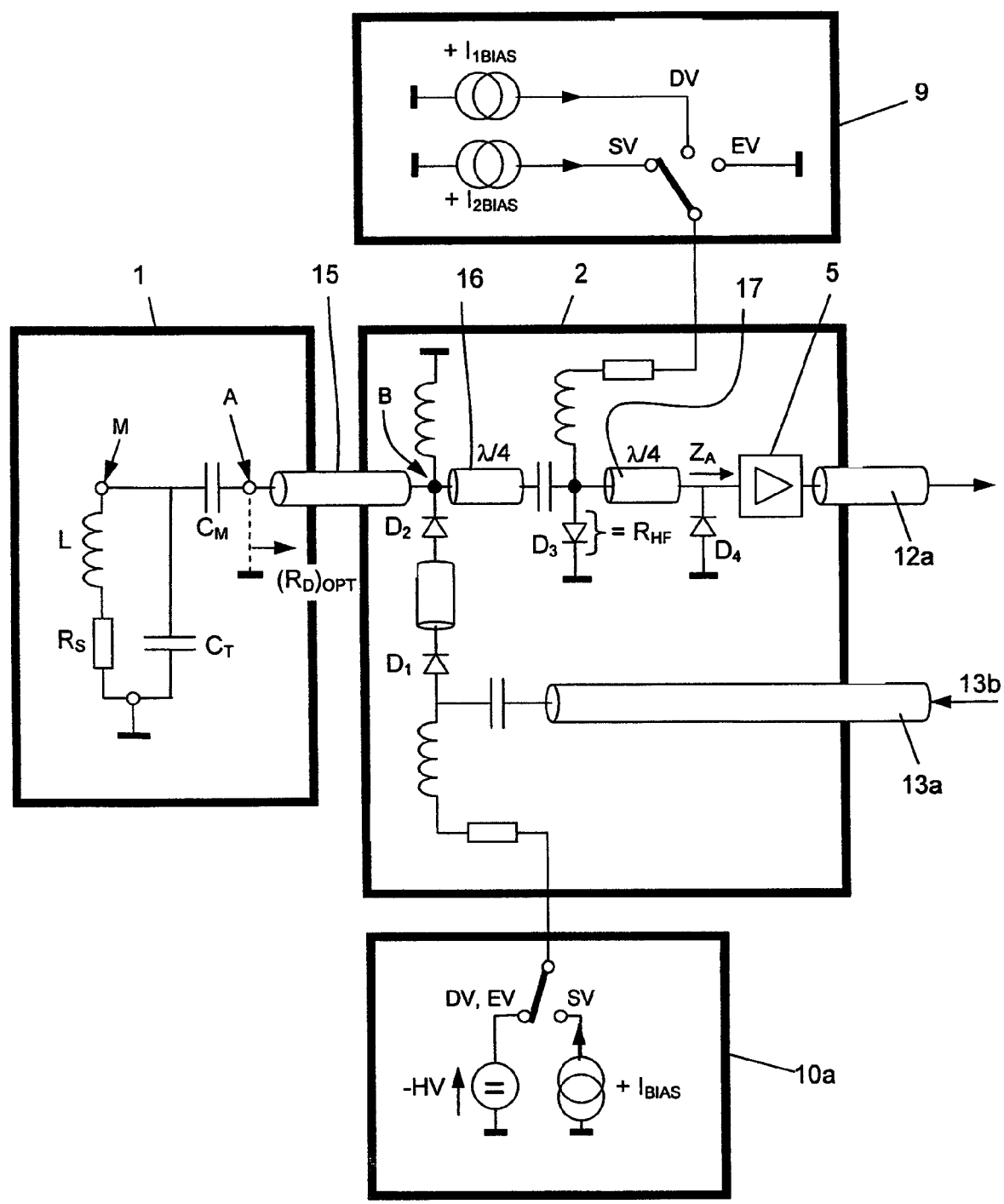
FIG. 3 shows a detailed diagram of an embodiment of the inventive MR detection configuration with capacitive coupling of the RF resonant circuit and optimum damping of the RF resonant circuit during the damping process by means of the RF resistance of a diode.

With this device, the RF resonant circuit 1 has an impedance for some microseconds after applying the transmitting pulse (switch position DV in the control circuit 9 and 10a), at which the energy in the RF resonant circuit 1 is discharged as quickly as possible, i.e. no strong decay signals remain, which could overload the preamplifier module 2, the LNA 5 contained therein and/or the following RF receiver 7 (not shown in FIG. 3). The base line artefacts caused by the decay signal are also considerably smaller.

The remaining energy within the RF resonant circuit 1 can be quickly discharged even during the receiving process EV when the two diodes D3, D4 block, by making sure that the input impedance $Z_A$ of the LNAs 5 is preferably transformed to the vicinity of $(R_D)_{OPT}$ up to the low-impedance connecting point A of the RF resonant circuit. This can be realized, since low noise GaAs LNAs have very high ohmic values even with input noise matching. For dimensioning the LNA 5, in particular, for noise matching the adjustment network AN, the priority is clearly to obtain a high SINO and adjust the noise of the preamplifier 5. Noise-matching of the preamplifier 5 leaves one degree of freedom, i.e. the phase of the reflection factor at the input of the preamplifier 5 which can be controlled by an input side cable length change of the RF line 15 within the preamplifier 5. This yields the correct input impedance $Z_A$ of the matching network AN and thus the maximum damping resistance at the low-impedance connecting point A during the receiving process EV without impairing noise matching.

It may also be shown that maximum damping of the decay signal during the receiving process EV is equivalent to minimum radiation damping. For minimum radiation damping during the receiving process EV, the coil current in the inductance L, which is produced by the induced voltage, should be minimum. This is the case when the absolute magnitude $|Z+j^*\omega^*L+R_S|$ is at a maximum (Z is the impedance from point M as viewed in the direction of the RF line 15). This means that radiation damping during the receiving process EV is also minimized using the same configuration that minimizes the decay time during the receiving process EV. Minimum radiation damping and a minimum decay signal electronically damp the RF resonant circuit 1 without affecting the SINO, since the LNA 5 is still noise-matched. This optimum damping improves the receiving bandwidth as a third effect, which reduces the influence of the NMR signals on the SINO at the band ends.

FIG. 4 shows an RF resonant circuit 1' with inductive coupling. A configuration of this type can also be optimally adjusted to minimize the decay time. The RF resonant circuit comprises a compensation capacitor $C_k$ for compensating the blind portion of inductive coupling $L_k$ (or also the primary stray inductance). The compensation capacitor $C_k$ is not an absolutely necessary physical component. This compensation can also be obtained by shortening the RF line 15. It can be shown that the optimum resistance of this configuration is $(R_D)_{OPT}=\omega \cdot M$. This configuration is more difficult to realize than the configuration with the capacitive coupling of FIG. 3. The compensation of the primary stray inductance is required to obtain a minimum decay time, since otherwise the current in the inductive coupling $L_k$ remains unnecessarily limited.

It can also be shown that when the damping resistance $R_D$ differs from the optimum impedance $(R_D)_{OPT}$, beat frequencies may occur in the decay signal. This can be simply explained in that the equivalent circuit of the RF resonant circuit 1' represents a network of fourth order which has two resonances in this topology with unfavorable damping by optimum impedance $(R_D)_{OPT}$.

Figure 5:
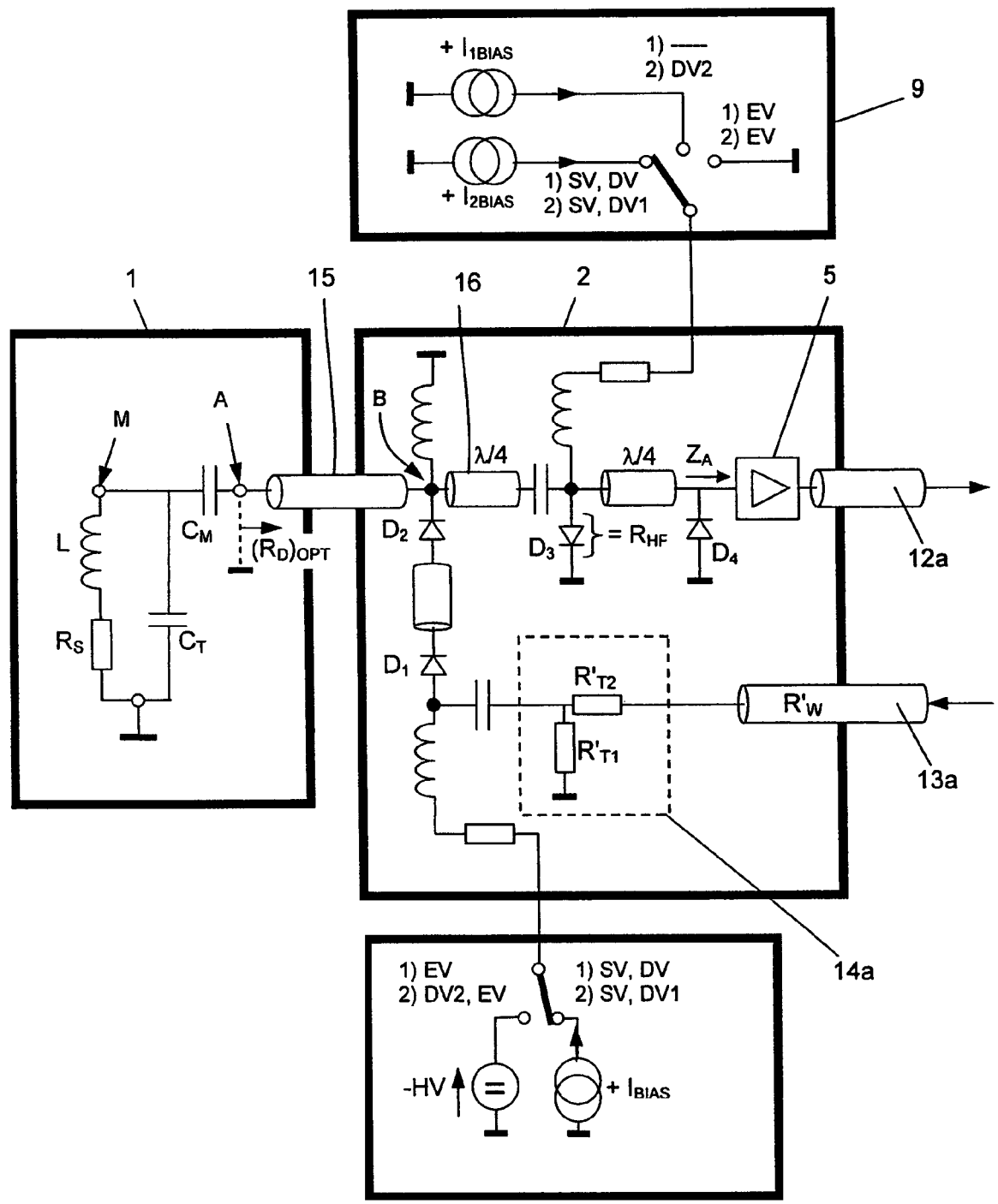
FIG. 5 shows a detailed circuit diagram of a further embodiment of the inventive MR detection configuration, with which the RF resonant circuit can be optimally damped during the transmitting process by a resistance group and during the damping process by the RF resistance of a diode.
Figure 6:
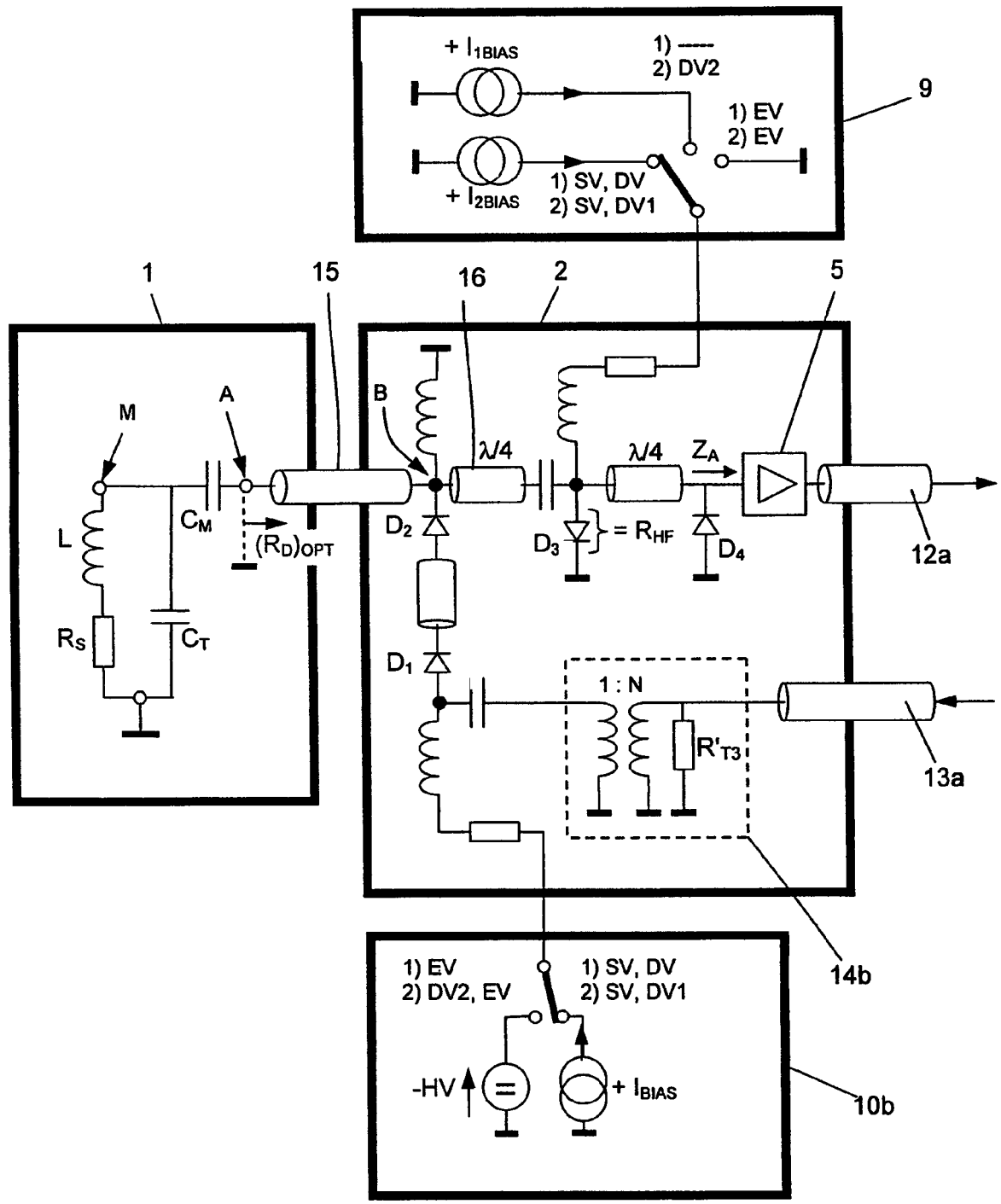
FIG. 6 shows a detailed diagram of a further embodiment of the inventive MR detection configuration, in which the RF resonant circuit can be optimally damped during the transmitting process by a resistance transformer network and during the damping process by the RF resistance of the diode.

FIG. 5 shows a detailed circuit diagram of a further embodiment of the inventive MR detecting configuration, wherein the RF resonant circuit can optionally be damped by a resistor group $R'_{T1}$, $R'_{T2}$, $R'_W$ ($R'_W$=characteristic impedance of the RF input line 13a and output impedance of the RF transmitter 8, typically also 50 ohms) and by the RF resistance of the diode D3. In this configuration, the rise time $\tau_{rise}$ of the current in inductance L is reduced during the transmitting process SV. This is achieved in that the RF resonant circuit 1 is additionally damped during the transmitting process SV in order to increase its frequency bandwidth to the required value. Also in this case, the RF resonant circuit 1 need not be interfered with and the required damping network 14a with damping resistances $R_{T1}$, $R_{T2}$ can be spatially and thermally separated from the RF resonant circuit 1. The receiving process EV offers the same possibilities as the transmitting process SV. Departing from power matching during the transmitting process SV, the rise time of the coil current can be dramatically reduced, as during the receiving process EV, by the reduction factor Q. The optimum is also the same in this case. The damping resistances $R'_{T1}$, $R'_{T2}$ transform the impedance $R'_W$ of the RF transmitter 8, such that the RF resonant circuit 1 has the optimum impedance $(R_D)_{OPT}$. This configuration is of course not very efficient, since the major part of the transmitting power is "wasted" in the damping resistances $R'_{T1}$ and $R'_{T2}$. The required transmitting power increases quadratically with the Q reduction factor. In another configuration which uses a transformer (FIG. 6) instead of the damping resistance R'$_{T2}$ in a damping network 14b, the required transmitting power increases linearly with the Q reduction factor. It still requires a damping resistance R'$_{T3}$ to adjust the RF transmitter 8 to R'$_W$ (50 ohms). If the rise time is reduced by a factor 10, the required power will be ten times larger in order to obtain the same coil current. This can be easily tolerated with an RF resonant circuit 1 with a high Q value, since it is based on lower powers corresponding to the high Q value.

One particular advantage thereof is also the fact that the RF transmitter 8 remains adjusted to the preamplifier module 2 when the network is correctly dimensioned, despite impedance transformation. Thus, no undesired transmission cut-offs or failures occur during the transmitting process SV.

The transmitter adjustment is maintained and for this reason, the normal methods for tuning the probe head via the RF input line 13a can be used. (tuning/matching, wobbling remain unchanged for the user, the system behaves as if it had a low Q value, as viewed from the outside). If required for the tuning process, the transformation circuit, which is preferably loss-free, can also be bridged through slight expansion of the system, which renders tuning more exact.

FIGS. 7a through 7e are the time dependencies of different signals during the transmitting, damping and receiving processes in the circuit of FIG. 3 or FIG. 4. The RF resonant circuit 1, 1' is optimally damped during the damping process DV using the diode D3, which yields a short decay time $\tau_{fall}$. There is no additional damping during the transmitting process SV (e.g. with the resistances R'$_{T1}$ and R'$_{T2}$ of FIG. 5), such that the rise time $\tau_{rise}$ of the transmitting pulse is relatively large. The further decay time during the receiving process EV is designated with $\tau_{EV}$.

Figure 7A:
FIG. 7a shows the time behavior of a transmitting pulse of the circuit of FIG. 3 or FIG. 4 which is fed into the RF resonant circuit.

FIG. 7a shows the idealized transmitting pulse as transmitted from the RF transmitter 8.

Figure 7B:
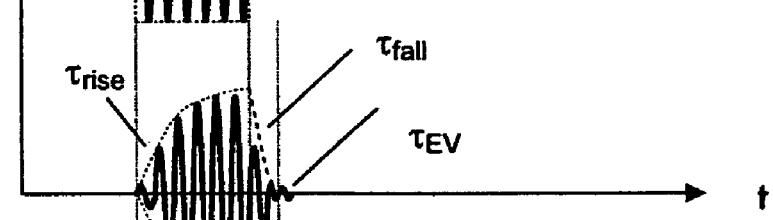
FIG. 7b shows the time behavior of the current in the inductance of the RF resonant circuit of the circuit of FIG. 3 or FIG. 4.

FIG. 7b shows the current of inductance L. This current rises exponentially with the time constant $\tau_{rise}$. $\tau_{rise}$ depends on the quality factor of the RF resonant circuit 1, 1' and produces the following value: $\tau_{rise}=Q_L/\omega$ with power matching on the transmitting side, wherein $Q_L$ corresponds to the coil Q value and $\omega$ is the angular frequency. After the transmitting process SV and during the damping process DV, the RF resonant circuit 1, 1' has an impedance other than 50 ohms. The time constant of the decaying signal is also different. If the RF resonant circuit 1, 1' were loaded with a short or open circuit, the decay time would be $\tau_{fall}=2*\tau_{rise}$. If the RF resonant circuit 1, 1' is loaded exactly with 50 ohms, $\tau_{fall}=\tau_{rise}$. It can be demonstrated that there is an optimum impedance $(R_D)_{OPT}$, at which $\tau_{fall}$ reaches a minimum. One can also talk of a Q reduction factor which states the relationship between the coil Q value $Q_L$ and the Q value of the RF resonant circuit 1, 1' with optimum impedance during the damping process DV. This Q reduction factor is calculated as follows (approximation for large $Q_L$):

$$\frac{Q_L}{Q_{reso}} = \frac{Q_L}{2 \cdot \left(\sqrt{\frac{Q_L \cdot R_{50}}{\omega \cdot L}} - 1\right)} + 1$$

$Q_L$: coil Q value $Q_{reso}$: Q value of the RF resonant circuit during the damping process $R_{50}$: system impedance, usually 50 ohms L: coil inductance The time constant $\tau_{fall}$ is optimally smaller than the time constant $\tau_{rise}$ by half the Q reduction factor.

Figure 7C:
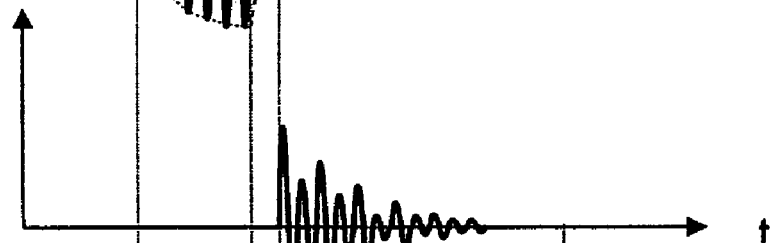
FIG. 7c shows the time behavior of the FID signal (nuclear resonance signal) of the circuit of FIG. 3 or FIG. 4.
Figure 7D:
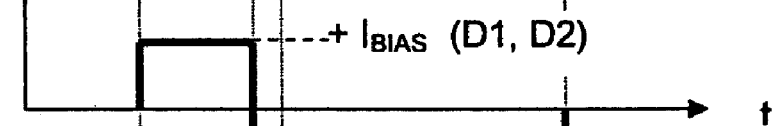
FIG. 7d shows the time behavior of the current and the voltage for controlling the transmitting diodes of the circuit of FIG. 3 or FIG. 4.
Figure 7E:
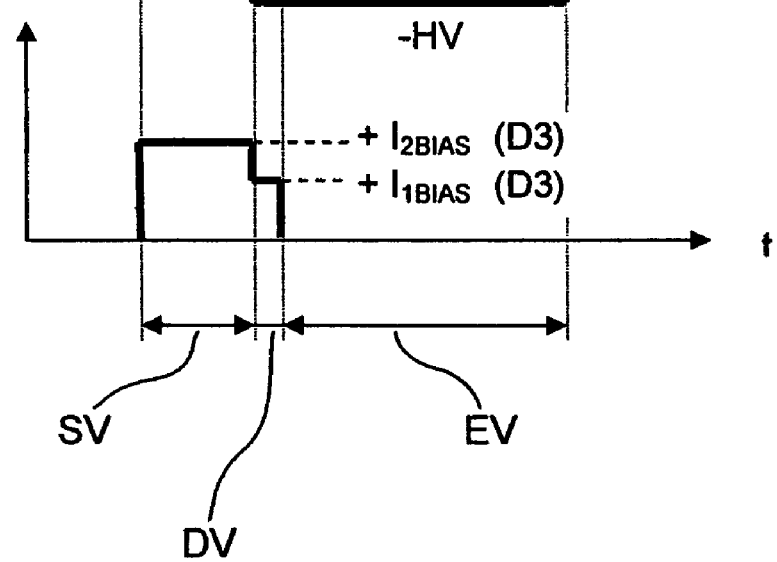
FIG. 7e shows the time behavior of the current for controlling the diode D3 of the circuit of FIG. 3 or FIG. 4.

FIG. 7c shows the NMR or FID signal. FIGS. 7d and 7e show the control signals for the three processes SV, DV, EV. A current flows through the transmitting diodes D1 and D2 during the transmitting process SV. The transmitting diodes D1 and D2 are blocked with high voltage (=HV) during the damping process DV, and a current flows through the diode D3 such that the RF resonant circuit 1, 1' is loaded with the optimum impedance $(R_D)_{OPT}$. The current in the diode D3 may be different during the transmitting and damping processes SV, DV. This is advantageous in that the optimum RF resistance of the diode D3 can be adjusted during the damping process DV. During the transmitting process SV, however, a current of maximum strength usually flows through the diode D3 such that it preferably reaches a low ohmic value and protects the preamplifier 5 from being overloaded. On the other hand, point B preferably reaches a high impedance value, thereby minimizing the influence on the transmitting process SV. During the receiving process EV, the current $I_{BIAS}$ for the diode D3 is switched off. It thereby reaches a high impedance value and does not influence the receiving process.

In accordance with FIGS. 9a through e, the advantages of an explicit damping circuit can be utilized during the damping process. This is advantageous in that the explicit damping device can i.a. still achieve optimum damping using diode D3 etc., while the achievable damping may be limited by the transformed transmitter impedance due to the associated loss in power efficiency.

The actual damping process is thus divided into two phases, which also have two different time constants $\tau_{fall\ 1}$, $\tau_{fall\ 2}$ for the decaying RF resonant circuit 1, 1'. FIGS. 9a through e show the time dependence of different signals during the transmitting, damping and receiving process in an embodiment of this type of circuit of FIG. 5 or FIG. 6. The RF resonant circuit 1 is additionally damped during the transmitting process SV and during the first part DV1 of the damping process using the damping resistances R'$_{T1}$, R'$_{T2}$ and R'$_{T3}$ respectively, and optimally damped during the second part DV2 of the damping process using the diode D3. This reduces the rise time $\tau_{rise}$ and the fall time $\tau_{fall}$ of the transmitting pulse. The residual signal decays with $\tau_{EV}$ during the receiving process EV.

Figure 8A:
FIG. 8a shows the time behavior of the transmitting pulse which is fed into the RF resonant circuit of a first embodiment of the circuit of FIG. 5 or FIG. 6.
Figure 8B:
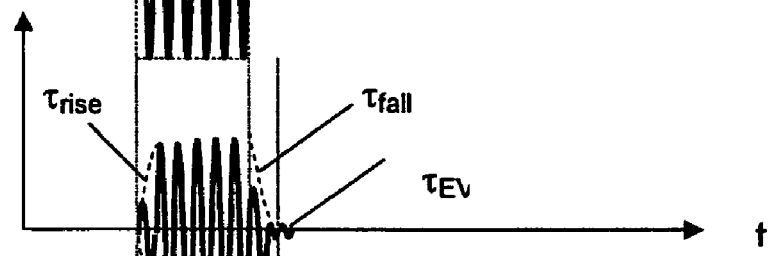
FIG. 8b shows the time behavior of the current in the inductance of the RF resonant circuit of a first embodiment of the circuit of FIG. 5 or FIG. 6.
Figure 8C:
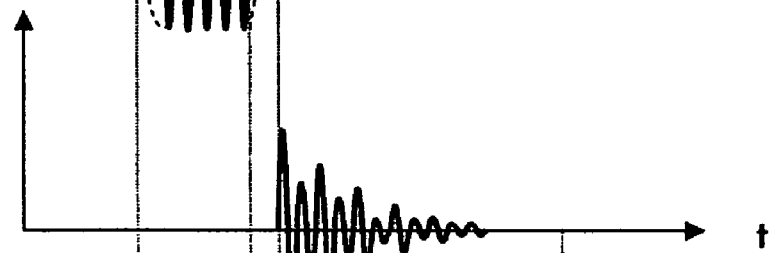
FIG. 8c shows the time behavior of the FID signal (nuclear resonance signal) of a first embodiment of the circuit of FIG. 5 or FIG. 6.
Figure 8D:
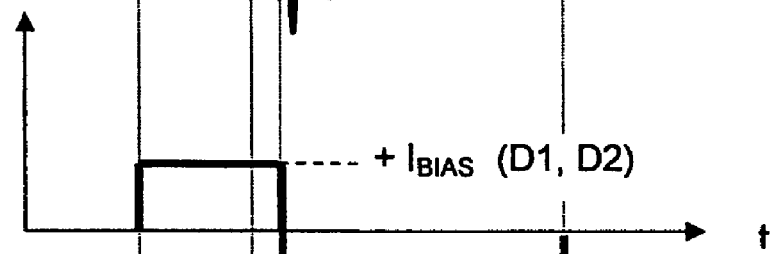
FIG. 8d shows the time behavior of the current and the voltage for controlling transmitting diodes of a first embodiment of the circuit of FIG. 5 or FIG. 6.
Figure 8E:
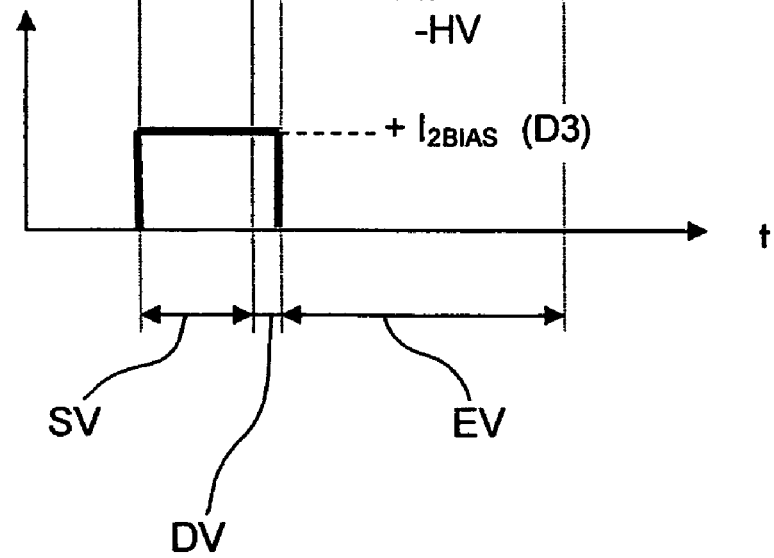
FIG. 8e shows the time behavior of the current for controlling the diode D3 of a first embodiment of the circuit of FIG. 5 or FIG. 6.
Figure 9A:
FIG. 9a shows the time behavior of a transmitting pulse which is fed into the RF resonant circuit of a second embodiment of the circuit of FIG. 5 or FIG. 6.
Figure 9B:
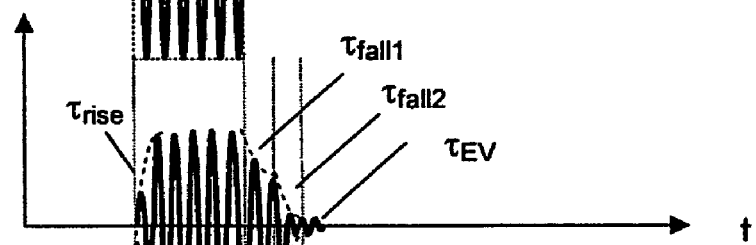
FIG. 9b shows the time behavior of the current in the inductance of the RF resonant circuit of a second embodiment of the circuit of FIG. 5 or FIG. 6.
Figure 9C:
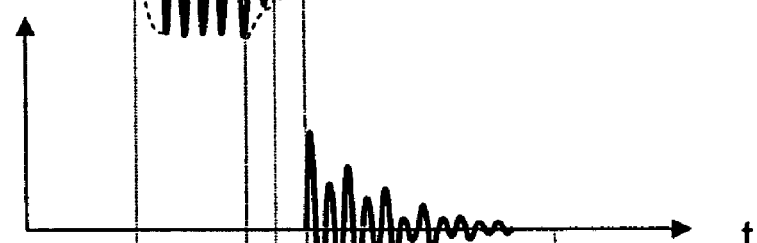
FIG. 9c shows the time behavior of the FID signal (nuclear resonance signal) of a second embodiment of the circuit of FIG. 5 or FIG. 6.
Figure 9D:
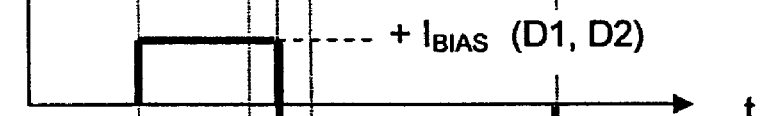
FIG. 9d shows the time behavior of the current and the voltage for controlling transmitting diodes of a second embodiment of the circuit of FIG. 5 or FIG. 6.
Figure 9E:
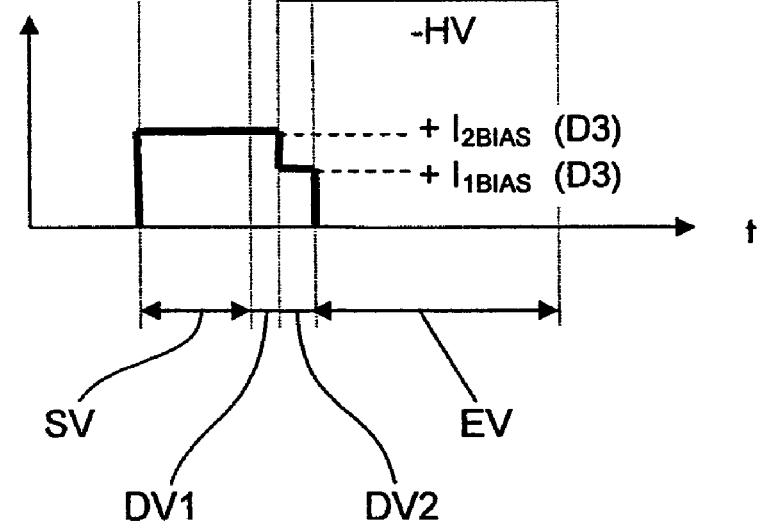
FIG. 9e shows the time behavior of the current for controlling the diode D3 of a second embodiment of the circuit of FIG. 5 or FIG. 6.
Figure 11A:
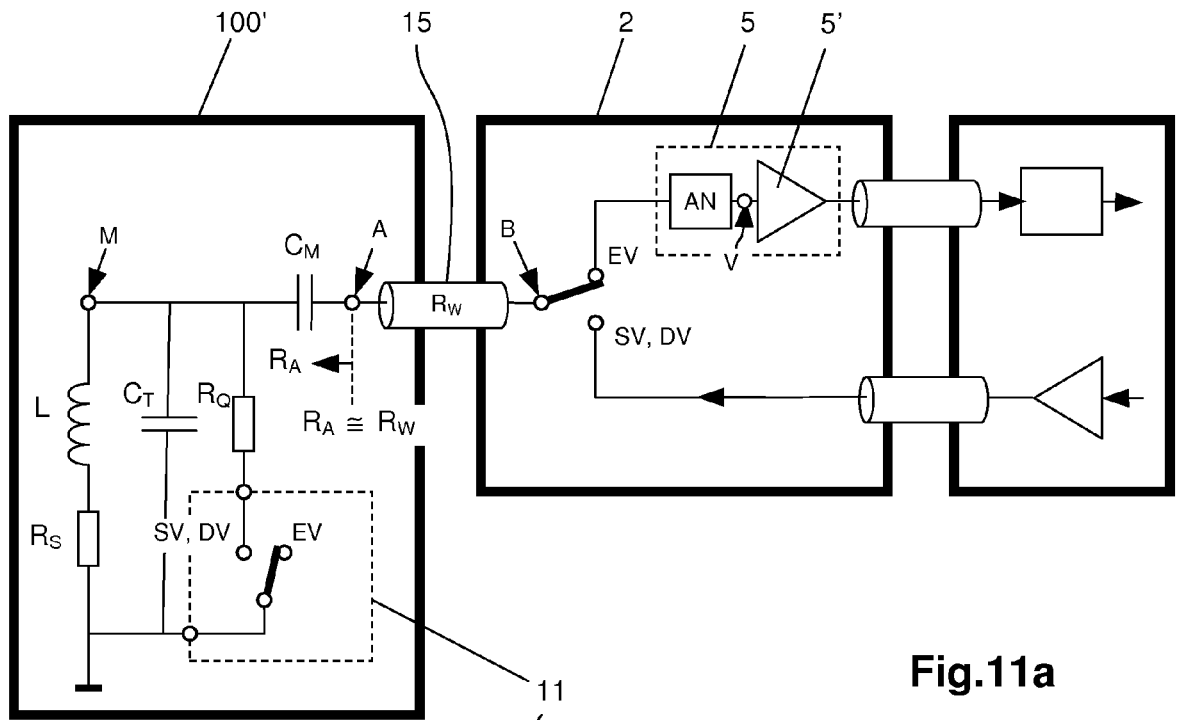
FIG. 11a shows a transmitting/receiving device in accordance with prior art, in which the RF resonant circuit is damped during the damping process using a Q switch.
Figure 11B:
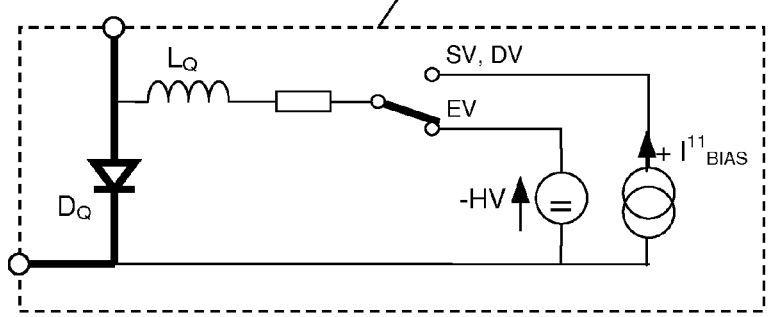
FIG. 11b shows one realization of a Q switch of FIG. 3 using a diode.

In particular, when the requirements are low, the presence or use of the explicit damping device using the diode D3 etc. can alternatively be omitted. FIGS. 8a-e show the time dependence of different signals during the transmitting, damping and receiving processes of this embodiment or mode of operation of the circuit of FIG. 5 or FIG. 6. The RF resonant circuit 1 is damped both during the transmitting process SV and during the damping process DV using the damping resistances R'$_{T1}$, R'$_{T2}$ and R'$_{T3}$, respectively. This reduces the rise time $\tau_{rise}$ and fall time $\tau_{fall}$ of the transmitting pulse. The residual signal decays with $\tau_{EV}$ during the receiving process. Thus, only the RF transmitting pulse is switched off during the damping process DV, which already results in automatically damped decay of the current of the RF resonant circuit 1, 1' (FIG. 8b). This is advantageous for those cases, in which damping using this mode of operation is sufficiently large, in that on the one hand, the complexity of the system and operation is reduced. Secondly, since the rise and decay times are identical, there will be no additional problems for calibrating the different pulse lengths (in practice, in particular 90 vs. 180 vs. 360 degrees), since the delays at the start and end of the pulse are identical and thus the length of the output pulse (as a current in the RF resonant circuit 1, 1') still corresponds linearly to the length of the transmitting pulse.

In general, it must be noted that with high damping factors and long RF lines 15, additional effects may occur due to the properties of the RF line 15. These may additionally influence, in particular, also reduce the maximum achievable damping ratio. This is due to the fact that the mentioned transformation properties of the lines only apply for exactly the working or resonance frequencies. For other frequencies, the transformations are slightly different. These effects increase the larger the cable length compared to the wavelength. As soon as the line lengths and damping are sufficiently large that these errors within the desired bandwidth of the damped system become significant, they must be taken into consideration in the design of the overall system and for optimizing the components, in order to obtain optimum results.

LIST OF REFERENCES (1) "A probehead with switchable quality factor. Suppression of radiation damping"; C. Anklin, M. Rindlisbacher, G. Otting and F. H. Laukien; J. Magn. Res. B106, p 199-201, 1995
(2) "Fast recovery, high sensitivity NMR probe and preamplifier for low frequencies"; D. I. Hoult; Rev. Sci. Instr. 50(2), February 1979
(3) "Interplay among recovery time, signal, and noise: Series- and parallel-tuned circuits are not always the same"; J. B. Miller, B. H. Suits, A. N. Garroway, M. A. Hepp; Concepts in Magn. Res. Vol 12, issue 3, p 125-136
(4) "NMR Signal Reception: Virtual Photons and Coherent Spontaneous Emission"; D. I. Hoult, B. Bhakar; Concepts in Magn. Res. Vol 9, issue 5, P 227-297

LIST OF REFERENCE NUMERALS

SV transmitting process
SV damping process
DV1 first partial process of the damping process
DV2 second partial process of the damping process
EV receiving process
AN matching network at the input of the preamplifier
A low-impedance connecting point of the RF resonant circuit
B reference point at the end of the RF line facing away from the RF resonant circuit
M high-impedance point of the inductance of the RF resonant circuit
V reference point in the preamplifier between the matching network and the active part of the preamplifier
$R_S$ loss resistance of the resonance inductance
$R_A$ transform of the loss resistances of the RF resonant circuit related to the low-impedance connecting point of the RF resonant circuit
$R_Q$ damping resistance of the "Q switch"
$R_W$ characteristic impedance of the RF line 15
$R'_W$ characteristic impedance of the RF input line 13a and the output impedance of the RF transmitter
$R_{HF}$ RF resistance of the diode D3 (this RF resistance depends on the DC current $I_{BIAS}$ that flows through the diode D3)
$R_D$ damping resistance during the damping process (belongs to the damping impedance $Z_{DV}$)
$(R_D)_{OPT}$ optimum damping resistance at the low-impedance connecting point of the RF resonant circuit, as viewed in the direction of the RF line $R_{T1}$, $R_{T2}$ damping resistances during the transmitting process which belong to the damping network 6a (are components of the damping impedance $Z_{SV}$)
$R'_{T1}$, $R'_{T2}$ damping resistances during the transmitting process that belong to the damping network 14a
$R'_{T3}$ damping resistance during the transmitting process that belongs to the damping network 14b with impedance transformer
L inductance of the RF resonant circuit
$L_K$ inductive coupling
$C_T$ resonance capacitance of the RF resonant circuit
$C_M$ coupling capacitor of the RF resonant circuit
$M_K$ mutual inductance of the inductive coupling
$C_K$ compensation capacitor of inductive coupling
$X_S$ reactance of the coupling capacitor $C_M(X_S=1/(\omega C_M))$
$Z_{SV}$ damping impedance during the transmitting process
$Z_{DV}$ damping impedance during the damping process
$Z_{SV}'$ damping impedance during the transmitting process
$Z_{DV}'$ damping impedance during the damping process
$Z_A$ input impedance of the matching network AN including preamplifier
D1 transmitting diode
D2 transmitting diode
D3 diode (component of the switching means)
D4 diode
$\tau_{rise}$ rise time (time constant) of the coil current during the transmitting process
$\tau_{fall}$ fall time (time constant) of the coil current during the damping process
$\tau_{fall1}$, $\tau_{fall2}$ fall time (time constant) of the coil current with two consecutive partial processes of the damping process
$\tau_{EV}$ fall time (time constant) of the coil current during the receiving process
$I_{BIAS}$ current within the control circuit
$I^{11}_{BIAS}$ current through the PIN diode
1 RF resonant circuit with capacitive coupling
1' RF resonant circuit with inductive coupling
100, 100' RF resonant circuit
1a RF transmitting resonant circuit
2 preamplifier module
3 transmitter/receiver module
4, 4', 4" RF switch in the preamplifier module
5 preamplifier (LNA) including matching network AN
5' active part of the preamplifier
6a, 6c damping network for the transmitting process
6b damping network for the damping process
7 RF receiver
8 RF transmitter
9 control circuit for the diode D3. The preamplifier 5 can be connected or disconnected by the diode D3. Moreover, damping of the RF resonant circuit during the damping process can be defined with the RF resistance $R_{HF}$ of the diode D3
10a control circuit for the transmitting diodes D1 and D2 that belong to the switching means. These transmitting diodes can connect/disconnect the signal from the RF transmitter to and from the RF resonant circuit. The circuits of FIG. 5 and FIG. 6 achieve at the same time also additional damping of the RF resonant circuit during the transmitting process using the resistances $R'_{T1}$, $R'_{T2}$ and $R'_{T3}$, respectively
11 RF switch of the "Q switch"
12a RF output line to the RF receiver
13a RF input line from the RF receiver
13b input signal from the RF transmitter
14a damping network for the transmitting process (it contains the damping resistances $R'_{T1}$, and $R'_{T2}$)

14b damping network for the transmitting process (it contains the damping resistance $R'_{T3}$ and an inductive impedance transformer)
15 RF connecting line between RF resonant circuit and preamplifier module
15a RF connecting line between RF transmitting resonant circuit and preamplifier module
16, 17 λ/4 line

We claim:

1. A method for operating a magnetic resonance (MR) detection configuration for investigation of a spin system, the configuration having at least one RF resonant circuit with an inductance having a high impedance point and a reactive transformation circuit connected between the high impedance point and a low-impedance connecting point of the RF resonant circuit, the reactive transformation circuit functioning as an impedance transformer, the configuration also having an RF line with a first connecting point connected to said low-impedance connecting point and a second connecting point, the RF line having a characteristic impedance, a preamplifier module connected to the second connecting point of the RF line, the preamplifier module having at least one passive damping impedance and switching means for connecting the passive damping impedance to the resonant circuit during a damping and/or transmitting process, an RF receiver for receiving signals from the spin system, and an RF transmitter, the method comprising the steps of:
  a) transmitting, during a transmission time period, RF pulses from the transmitter to the RF resonant circuit to excite the spin system;
  b) terminating the transmission time period by stopping transmission of the RF pulses to the RF resonant circuit;
  c) initiating, immediately following step b), a damping time period;
  d) controlling, during step c), current flow through the passive damping impedance to optimise rapid damping of residual current in the RF resonant circuit;
  e) blocking current flow through the damping impedance to terminate the damping time period;
  f) initiating, immediately following step e), a receiving time period; and
  g) detecting RF signals from the spin system during step f).

2. A device for operating a magnetic resonance (MR) detection configuration using the method of claim 1, the device comprising:
  means for transmitting RF pulses from the transmitter to the RF resonant circuit to excite the spin system;
  means for stopping transmission of the RF pulses to the RF resonant circuit;
  means for controlling current flow through the passive damping impedance to optimise rapid damping of residual current in the RF resonant circuit;
  means for blocking current flow through the damping impedance; and
  means for detecting RF signals from the spin system.

3. The device of claim 2, wherein a respective amount of complex reflection factor of said passive damping impedance, relative to said RF line characteristic impedance, exceeds a value of 0.5.

4. The MR detection configuration of claim 3, wherein said RF resonant circuit excites the spin system during said transmitting process and detects FID signals during a receiving process, wherein said switching means connects said RF resonant circuit to said RF receiver during said receiving process and to said RF transmitter during said transmitting process.

5. The MR detection configuration of claim 4, wherein said switching means comprises a three-phased RF switch.

6. A method for damping the RF resonant circuit of the MR detection configuration of claim 4, wherein, during the damping and/or transmitting process, the RF resonant circuit is damped with a time constant reduction which is larger than a factor of 2 compared to a termination with the characteristic impedance of the RF line at the low-impedance by connecting point, by connecting the passive damping impedance to the resonant circuit using the switching means.

7. The method of claim 6, wherein the spin system is excited during the transmitting process and the FID signal is detected during the receiving process using a same RF resonant circuit.

8. The MR detection configuration of claim 3, wherein said RF resonant circuit is only used to detect FID signals during a receiving process and can be damped with said passive damping impedance during said damping process, and further comprising an RF transmitting resonant circuit for exciting the spin system during said transmitting process and at least one further passive damping impedance which is connected to said RF transmitting resonant circuit during said transmitting and/or damping process to damp said RF transmitting resonant circuit.

9. The MR detection configuration of claim 8, wherein said RF transmitting resonant circuit is spatially orthogonal to said RF resonant circuit.

10. A method for damping the RF resonant circuit of the MR detection configuration claim 8, wherein, during the damping and/or transmitting process, the RF resonant circuit is damped with a time constant reduction which is larger than a factor of 2 compared to a termination with the characteristic impedance of the RF line at the low-impedance connecting point, by connecting the passive damping impedance to the resonant circuit using the switching means.

11. The method of claim 10, wherein an FID signal is detected during the receiving process using the RF resonant circuit and the spin system is excited during the transmitting process using the RF transmitting resonant circuit.

12. The MR detection configuration of claim 3, wherein said passive damping impedance is selected to effect an optimum impedance $(R_D)_{OPT}$ at said low-impedance connecting point, as viewed in a direction of said RF line, to cause maximum damping and thereby fastest decay of said RF resonant circuit, wherein, in an inductive transformer circuit with a reactive portion of coupling inductance ($L_K$) being capacitively compensated for by a capacitor, ($C_K$), $(R_D)_{opt}=\omega*M_k$ applies with good approximation, wherein $M_k$ is a mutual inductance.

13. The MR detection configuration of claim 3, wherein said passive damping impedance is selected such that there is an optimum impedance $(R_D)_{OPT}$ at said low-impedance connecting point, as viewed in a direction of said RF line, to cause maximum damping and thereby a fastest decay of said RF resonant circuit, wherein said reactive transformation circuit comprises a capacitive reactance ($X_S$) which acts as an impedance transformer, said optimum impedance $(R_D)_{OPT}$ being determined by a value of said reactance $X_S$, wherein $(R_D)_{OPT}=X_S$ applies with good approximation.

14. The MR detection configuration of claim 3, wherein said passive damping impedance comprises a damping network having a connection to said RF transmitter, wherein said network thereby is matched to said RF transmitter.

15. A method for damping the RF resonant circuit of the MR detection configuration claim 14, wherein, during the damping and/or transmitting process, the RF resonant circuit is damped with a time constant reduction which is larger than a factor of 2 compared to a termination with the characteristic impedance of the RF line at the low-impedance connecting point, by connecting the passive damping impedance to the resonant circuit using the switching means.

16. The method of claim 15, wherein the passive damping impedance connected during the transmitting and/or damping process via the RF transmitting line, is generated using the damping network, which is connected to the RF transmitter and is matched to the transmitter.

17. The MR detection configuration of claim 3, wherein said passive damping impedance comprises a controllable RF resistance or a PIN diode.

18. A method for damping the RF resonant circuit of the MR detection configuration claim 17, wherein, during the damping and/or transmitting process, the RF resonant circuit is damped with a time constant reduction which is larger than a factor of 2 compared to a termination with the characteristic impedance of the RF line at the low-impedance connecting point, by connecting the passive damping impedance to the resonant circuit using the switching means.

19. The method of claim 18, wherein an optimum impedance is generated by the controllable RF resistance and subsequent transformation at the low-impedance connecting point.

20. A method for damping the RF resonant circuit of the MR detection configuration of claim 3, wherein, during the damping and/or transmitting process, the RF resonant circuit is damped with a time constant reduction which is larger than a factor of 2 compared to a termination with the characteristic impedance of the RF line at the low-impedance connecting point, by connecting the passive damping impedance to the resonant circuit using the switching means.

* * * * *